United States Patent [19]

Hodsoll, Jr. et al.

[11] Patent Number: 4,667,159
[45] Date of Patent: May 19, 1987

[54] METHOD OF, AND APPARATUS FOR, MINIMIZING MAGNETIC RESONANCE IMAGING ARTIFACTS DUE TO POWER LINE INTERFERENCE

[75] Inventors: Raymond J. Hodsoll, Jr., Galway; Steven G. Karr, Schenectady; William M. Leue, Albany; Lowell S. Smith; Rowland W. Redington, both of Schenectady; Paul A. Bottomley, Clifton Park; William A. Edelstein, Schenectady, all of N.Y.

[73] Assignee: General Electric Company, Schenectady, N.Y.

[21] Appl. No.: 743,114

[22] Filed: Jun. 10, 1985

[51] Int. Cl.⁴ .............................................. G01R 33/20
[52] U.S. Cl. ................................... 324/309; 324/314; 324/322
[58] Field of Search ............... 324/307, 309, 318, 321, 324/314, 322; 358/148; 331/53

[56] References Cited

U.S. PATENT DOCUMENTS

| Re. 23,950 | 2/1955 | Bloch et al. | 324/307 |
|---|---|---|---|
| 2,999,976 | 9/1961 | Francis et al. | 324/307 |
| 3,916,402 | 10/1975 | Hornung | 358/148 X |
| 4,476,490 | 10/1984 | Kaneko | 358/148 |
| 4,549,140 | 10/1985 | MacFall | 324/309 |
| 4,567,893 | 2/1986 | Charles et al. | 324/309 X |

OTHER PUBLICATIONS

Johnson, G. et al, "Instrumentation for NMR Spin-Warp Imaging", J. Phys. E. Sci & Instrum., vol. 15, No. 1, Jan. 1982, pp. 74–79.

Primary Examiner—Michael J. Tokar
Assistant Examiner—Francis J. Jaworski
Attorney, Agent, or Firm—Geoffrey H. Krauss; James C. Davis, Jr.; Marvin Snyder

[57] ABSTRACT

Power line interference artifacts in a magnetic resonance image are minimized by the process of: providing a sequential plurality of imaging signal sequences, the totality of which sequences is required for determining the value of each image pixel in an image array thereof; requesting the start of each sequence of the plurality of imaging signal sequences prior to the actual time at which each such signal sequence should commence; preparing a recognition element prior to the desired actual commencement time; recognizing a predetermined occurrence of a repetitive power line signal parameter to provide a first signal; setting the recognition element responsive to the first signal to only then cause the signal sequence start request to actually cause commencement of the associated signal sequence; and causing each signal sequence to occur in essentially an integral number of sequential repetitive cycles of the power line signal waveform to minimize the magnitude of power line frequency signal interference artifacts in the resulting magnetic resonance image.

16 Claims, 9 Drawing Figures

METHOD OF, AND APPARATUS FOR, MINIMIZING MAGNETIC RESONANCE IMAGING ARTIFACTS DUE TO POWER LINE INTERFERENCE

RELATED APPLICATIONS

This application is related to application Ser. Nos. (743,125) and (743,119), filed June 10, 1985, assigned to the assignee of the present invention and incorporated in their entireties herein by reference.

BACKGROUND OF THE INVENTION

The present invention relates to magnetic resonance imaging and, more particularly, to a novel method of, and novel apparatus for, minimizing magnetic resonance (NMR) imaging motion artifacts due to power line interference.

It is well known that the power line signal alternating-polarity waveform can produce interference in any number of electronic systems. During nuclear magnetic resonance imaging, the energization of various system portions by power supplies receiving the power line waveform, will often allow artifacts related to the power line frequency (e.g. 60 Hz. in the United States) to have a deleterious effect on image quality. We have found that the ubiquitous nature of power line frequency signals requires that some form of synchronization be utilized to allow imaged data signal collection to take place over an integral number of power line frequency cycles for each imaging data collection sequence utilized in the magnetic resonance system. Only if such synchronized data collection occurs can the amplitude of the interference be made repeatable over each signal collection interval, so that the signal collection results can be suitably processed to essentially remove the artifacts and allow the resulting image to be essentially free of the line-frequency artifacts. It is highly desirable to provide methods of, and apparatus for, minimizing magnetic resonance imaging artifacts due to power-line-frequency interference.

BRIEF SUMMARY OF THE INVENTION

In accordance with the invention, power line interference artifacts in a magnetic resonance image are minimized by the process of: providing a sequential plurality of imaging signal sequences, the totality of which sequences is required for determining the value of each image pixel in an image array thereof; requesting the start of each sequence of the plurality of imaging signal sequences prior to the actual time at which each such signal sequence should commence; preparing a recognition element prior to the desired actual commencement time; recognizing a predetermined occurrence of a repetitive power line signal parameter to provide a first signal; setting the recognition element responsive to the first signal to only then cause the signal sequence start request to actually cause commencement of the associated signal sequence; and causing each signal sequence to occur in essentially an integral number of sequential repetitive cycles of the power line signal waveform to minimize the magnitude of power line frequency signal interference artifacts in the resulting magnetic resonance image.

In presently preferred embodiments, the synchronization signal is obtained from a zero-crossing detector, either directly or after conditioning in a phase-locked loop to remove line signal noise spikes and the like extraneous information.

Accordingly, it is one object of the present invention to provide novel methods for minimizing the magnitude of interference by power line frequency signals artifacts in magnetic resonance images.

It is another object of the present invention to provide novel apparatus for minimizing the magnitude of artifacts caused by power signal line interference in magnetic resonance images.

These and other objects of the present invention will become apparent upon reading the following detailed description, when considered in conjunction with the drawings.

DETAILED DESCRIPTION OF THE INVENTION

Figure 1A:
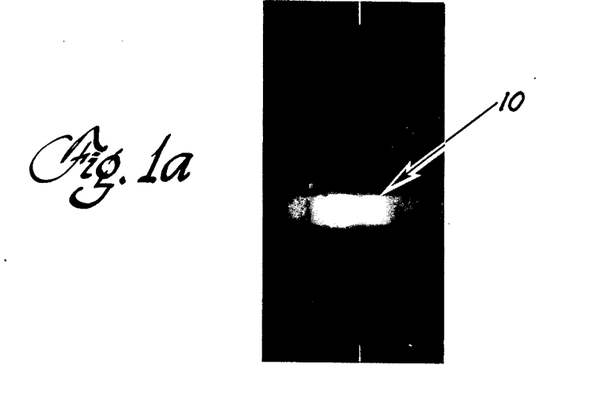
FIG. 1a and 1b are photographs of images of a phantom cylinder, respectively obtained totally without synchronization, and with system sequence synchronization to an independent means closely approximating the power line frequency.
Figure 1B:
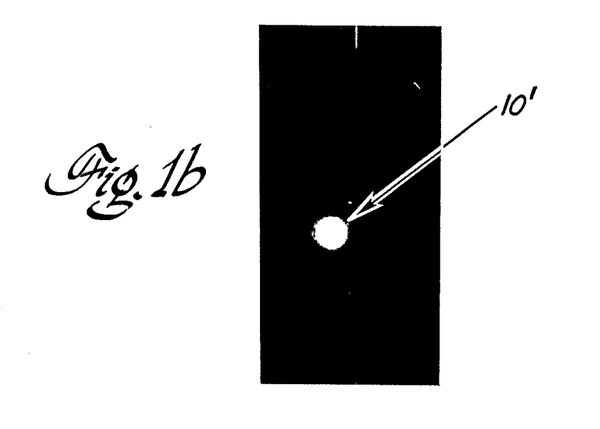

Referring initially to FIGS. 1a and 1b, a first magnetic resonance image 10 is an axial view through a cylindrical phantom sample and has a 128×128 array of pixels, each of value resulting from three sample averages utilizing a spin-warp imaging technique. A repetition rate $T_R$ about 200 milliseconds was utilized, with a maximum error on the order of 0.1 milliseconds at the end of the averaging time interval. This repetition rate was primarily chosen to represent an integer number of cycles of the power line signal waveform (e.g. 12 cycles of the 60 Hz. power line signal frequency in the United States). As will be seen, power line frequency interference, believed to be most likely derived from ripple induced in the main static magnetic field, one or more of the gradient magnetic fields and/or the radio-frequency magnetic field utilized in magnetic resonance imaging, has caused the image (which should have a sharp-edged circular cross section) to have an elongated and fuzzy-edged form.

Removal of a large percentage of this interference is illustrated in FIG. 1b, wherein the same cylindrical phantom is imaged in the axial plane with substantially the same parameters as utilized in obtaining the image of FIG. 1a, except for imaging signal sequence synchronization. In FIG. 1b, the image is obtained with the sequence repetition time interval $T_R$ being set to essentially 200.000 milliseconds and synchronized with a highly stable clock generator, e.g. a quartz crystal-controlled oscillator or the like.

Figure 1C:
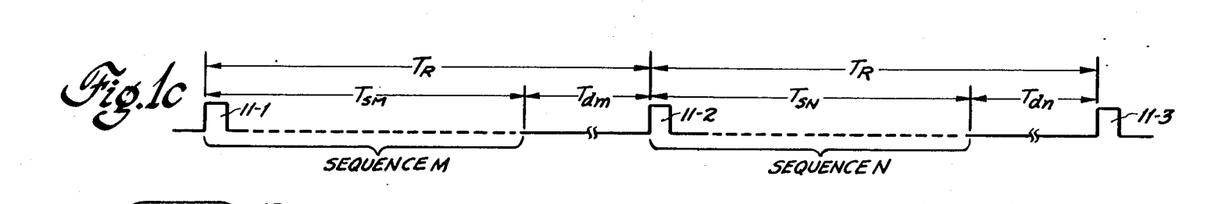
FIG. 1c is a graphic representation of the sequence, delay and repetition timing parameters for consecutive imaging sequences utilized in obtaining the images of FIGS. 1a and 1b.
Figure 1D:
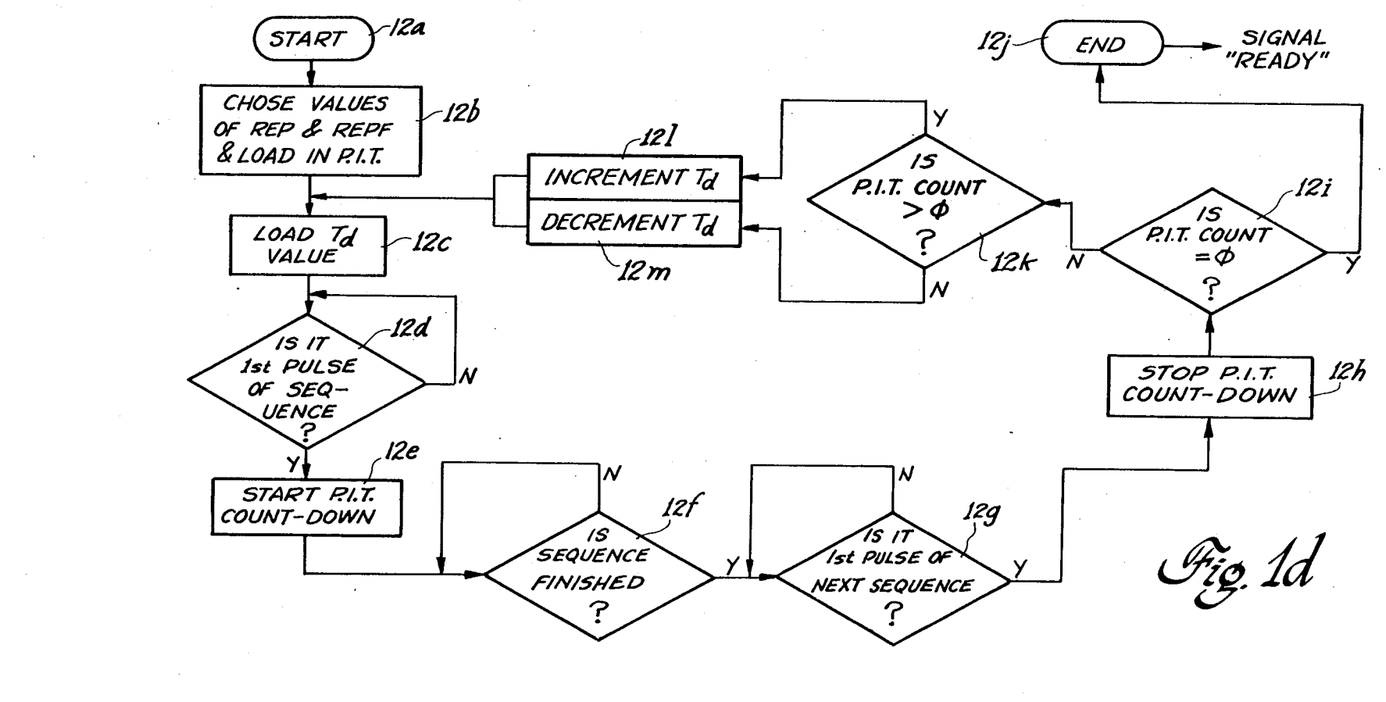
FIG. 1d is a flow chart illustrating the method utilized for obtaining the independently synchronized image of FIG. 1b.

Referring now to all of FIGS. 1b-1d, the effect of synchronizing the imaging signal sequence repetition interval $T_R$ to be exactly an integer number of the power line average frequency cycles is, as illustrated in FIG. 1c, such as to set the delay time $T_d$ (at the end of each imaging sequence time interval $T_S$) to provide the sequence-to-sequence repetition time interval $T_R$, e.g. between the initial edge of the first pulse in each sequence and the initial edge of the first pulse in the next subsequent sequence, to equal essentially the product of the desired number of line average frequency cycles and the time required for one line average frequency cycle. Thus, where each of the time intervals $T_S$ (e.g. intervals $T_{SM}$, $T_{SN}$, ...) are of essentially the same duration for sequential imaging signal sequences, e.g. sequence M, sequence N, ..., the time delay to be added to each sequence, e.g. time delay $T_{dm}$, $T_{dn}$, ..., will all be identical. To assure that the correct total delay time $T_d$ is chosen, the imaging system is initially operated, prior to acquisition of data to be utilized for actual imaging, to determine if the sum of the sequence time interval and the selected delay time interval is essentially equal to the required multi-cycle repetition time interval. Thus, at some time prior to obtaining actual image information, with or without the sample-to-be-imaged present in the imaging system, the procedure of FIG. 1d is carried out. After the procedure is physically started (step 12a), the value of two variables, i.e. a first variable REP which establishes coarse steps of the repetition time interval $T_R$ in increments of about 1 millisecond each (in the range from 1 millisecond to about 4096 milliseconds) and a second variable REPF which establishes a fine increment value for time interval $T_R$ in increments of about 1 microsecond each (in the range from about 1 microsecond to about 4096 microseconds) to be added to the chosen value of the first REP variable, are selected. These select values of the REP and REPF variables are loaded into a pulse interval countdown timer (P.I.T.), as shown in step 12b. Thereafter, the tentative value for the time delay $T_d$ time interval is chosen by subtraction of the sequence time interval $T_S$ as programmed for the system, from the desired intersequence time interval $T_R$; the delay time interval $T_d$ is loaded into a system memory location, in step 12c. Thereafter, step 12d is entered and the system computer continually tests to ascertain if the first pulse of a sequence has occurred, e.g. has the leading edge of the first pulse 11-1 of a first imaging sequence M occurred? If, for whatever reason, the leading edge of the first pulse, e.g. pulse 11-1, has not yet occurred, the No exit from step 12d is taken and the procedure returns to the beginning of step 12d for another determination. The loop around step 12d continues until the first pulse 11-1 of the first sequence is identified, at which time step 12d is satisfied and the Yes condition exits to step 12e. The pulse interval timer values (loaded by the REP and REPF variables) are now counted down in accordance with the frequency of the highly-stable crystal-controlled clock oscillator. Step 12e latches the pulse interval timer into the counting condition and then exits to step 12f. The sequence then in progress, e.g. sequence M, is continually observed by step 12f, until the end of that sequence, e.g. at the end of time interval $T_{SM}$. Only at that time will an affirmative Yes answer be generated by step 12f and step 12g entered. Step 12g continually checks the operation of the magnetic resonance imaging system to determine if the delay time interval, e.g. time interval $T_{dm}$, has elapsed, by checking for the leading edge of the first pulse of the next sequence, i.e. the leading edge of the first pulse 11-2 of the next sequence N. When the leading edge of the first pulse of the next sequence is recognized, step 12h is entered and the pulse interval timer countdown is stopped. Step 12i is now entered and the actual count within the pulse interval timer is now checked for equality to a zero count (indicative of the total of sequence time interval $T_S$ and delay time interval $T_d$ being equal, within the limits of the time resolution of the interval timer, to intersequence time interval $T_R$). If the pulse interval timer count is in fact zero, the intersequence time interval $T_R$ is correct, within the error assignable to the pulse interval timer and the particular clock frequency utilized for the counting down thereof, and "end" step 12j is entered. Since a relatively high frequency, e.g. 10 MHz., clock may be typically utilized, the clock-frequency-induced uncertainty, e.g. of about ±0.1 microseconds, is sufficiently small with respect to the total intersequence time interval $T_R$ desired (e.g. about 0.5 parts-per-million) as to allow substantially negligible power line frequency interference to be observed in the actual image, as illustrated by the FIG. 1b image of the test phantom. In the event that the pulse interval timer count was not found to be zero in step 12i, step 12k is entered and the pulse interval timer count is examined to determine if that count is greater or less than a zero count. If the count is greater than zero, e.g. step 12k having an affirmative Y determination, the delay time interval $T_d$ is too small to extend the sequence time interval $T_S$ to equal the desired intersequence time interval $T_R$, and step 12l is entered and the value of time interval $T_d$ is incremented. Conversely, if the pulse interval timer count is less that zero, too many clock cycles have been counted by the interval timer, indicative of delay time interval $T_d$ being of greater duration than is required. Accordingly, the negative N exit is taken from step 12k, and step 12m is entered to decrement the delay interval $T_d$ value. Having adjusted the delay interval $T_d$ value in either of steps 12l or 12m, the adjusted value is now loaded, by reentering step 12c into its register. The sequence of steps 12d-12i is again traversed. If the pulse interval timer count in step 12i is now equal to zero, the ending step 12j is entered and the imaging system receives a "ready" signal. If the count is still not equal to zero in step 12i, step 12k and the appropriate one of step 12l or 12m is again entered to continue the adjustment of the delay interval $T_d$ value loaded in step 12c, prior to recommencement of steps 12d-12i. The procedure from step 12c through step 12m is carried out a sufficient number of times for step 12i to become true, whereby exiting through step 12j and signaling of "ready" to the system computer is obtained. Having established the intersequence repetition time interval $T_R$ to a high degree of timing accuracy, the actual imaging procedure is carried out with substantial alleviation of power line frequency interference artifacts.

Figure 2A:
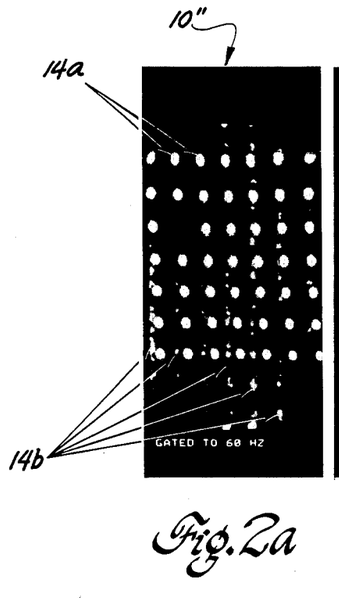
FIGS. 2a and 2b are photographs of a magnetic resonance image taken in the axial plane through a phantom cylinder array, respectively with asynchronous sequencing and with imaging sequences synchronized to the waveform zero crossings of the power line signal.
Figure 2B:
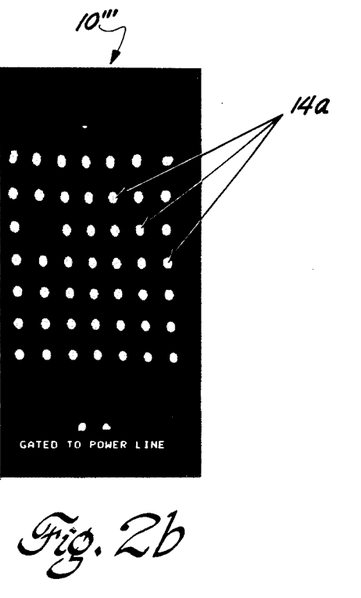

Referring now to FIG. 2a, an image 10" of an array of phantoms 14a, even though synchronized to a highly-stable crystal oscillator as described hereinabove, still shows streaking artifacts 14b caused by power line frequency interference. We have found that this is due to the asynchronous nature of the commencement of each imaging sequence, with respect to the actual commencement, i.e. the zero crossing, of the power line signal. That is, the power line frequency is essentially, but not exactly, at 60 Hz. over any time interval. Typical short-term variations for a 60 Hz. average-frequency power line are on the order of ±0.02 Hz., or about 330 parts-per-million. This variation is sufficient, as will be seen from FIG. 2a, to still provide narrow, but nevertheless discernible, artifacts 14b. As illustrated in FIG. 2b, wherein another image 10''' of the same array of phantoms 14a appears, we have found that synchronizing the start of each imaging sequence with a chosen point, e.g. the zero crossing in a selected (positive) direction, of the actual power line signal waveform, allows even the streaking artifacts to be alleviated.

Figure 2C:
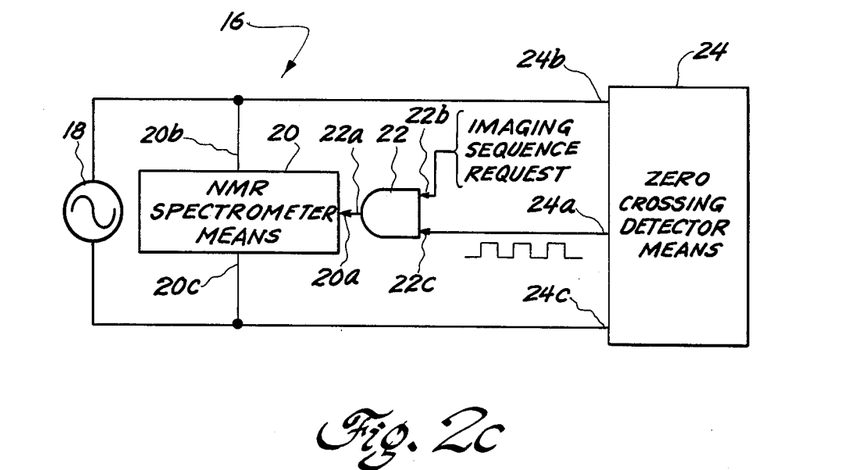
FIG. 2c is a schematic block diagram of the generalized means for obtaining the power line frequency synchronized gated scanning signals utilized in obtaining the image of FIG. 2b.

Referring now to FIG. 2c, in accordance with one method of the present invention, the start of each of a plurality of NMR imaging magnetic resonance imaging sequences, necessary to provide the total image, is synchronized with an interfering power line signal by detecting the zero crossings of the power line frequency and utilizing the zero-crossing occurrences to cause commencement of the imaging sequence. Imaging apparatus 16 is powered from an A.C. source 18. In addition to magnetic field providing means (not shown for reasons of simplicity), apparatus 16 also includes a nuclear magnetic resonance (NMR) spectrometer means 20, which provides the necessary RF excitation signal, and subsequently receives imaging response signals from the sample to be imaged, responsive to an imaging sequence start signal provided at an input 20a. Spectrometer means 20 is provided with operating energy by connection of means power inputs 20b and 20c to power source 18.

In accordance with one aspect of the present invention, a spectrometer sequence start signal at input 20a is provided at the output 22a of a logic means 22, e.g. an AND gate, receiving an imaging sequence request signal at a first input 22b and receiving a zero-crossing signal at a second input 22c. The zero-crossing signal is provided at an output 24a of a zero-crossing detector means 24 and has a change in amplitude, as between first and second binary signal levels, responsive to the passage through zero potential of the source 18 A.C. power line signal waveform, provided at inputs 24b and 24c of the zero-crossing detector means. Thus, the imaging sequence request signal (at logic means input 22b) need only be provided (by system controller means not shown) at some time prior to the desired start of each signal sequence (and typically after termination of the last prior signal sequence), and need not be particularly synchronized with the A.C. waveform of source 18; an enabling, high-logic-level imaging sequence request signal at input 22b will not appear as a high-logic-level sequence start signal at spectrometer input 20a until second logic means input 22c also receives a high-logic-level signal from the zero-crossing detector means output 24a. The signal at detector means output 24a, and therefore at logic input 22c, is an essentially square waveform signal; each of the sequential waveform edges occurs at one of the sequential zero crossings of the source 18 signal sinusoidal waveform. If the sequence start signal at input 20a is to be responsive to only one of the input 22c edges, i.e. preferably only to an input 22c in a predetermined direction, e.g. a positive-going edge, then the NMR imaging system controller means must provide the imaging sequence request signal at input 22b at a time shortly before an associated power line zero crossing in the desired direction. That is, the imaging sequence request signal should not be present at input 22b at any time prior to one line-frequency cycle time interval before the desired synchronizing zero crossing.

Figure 2D:
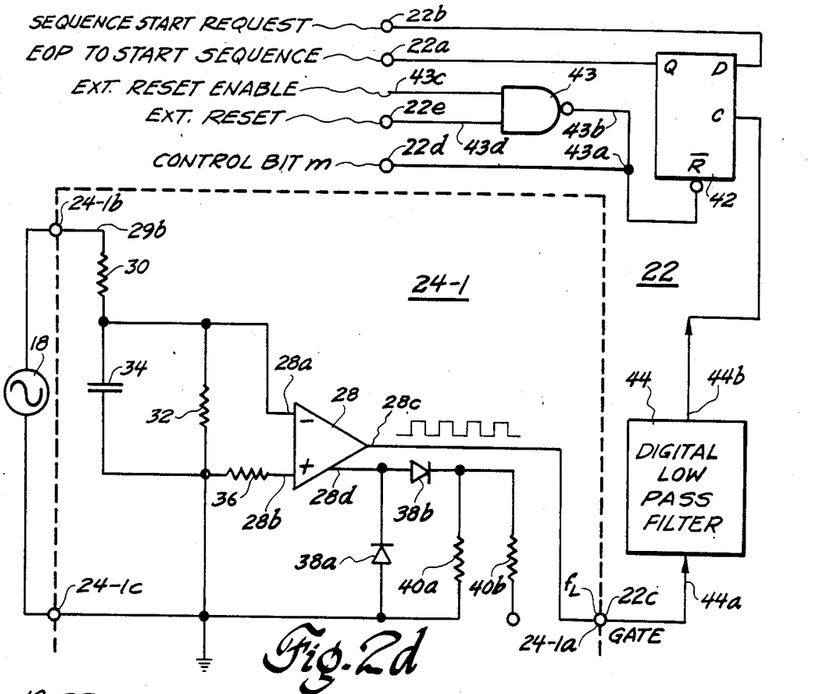
FIG. 2d is a schematic block diagram of one presently preferred form of apparatus for actual line frequency zero-crossing synchronization of magnetic resonance imaging sequences.

Referring now to FIG. 2d, one presently preferred form is illustrated of zero-crossing detector means 24-1 and of a logic means 22. Means 22 and 24-1 can, for example, be utilized with the digital interface subsystem described particularly with respect to FIG. 2 of the abovementioned co-pending applications. Any imaging apparatus control system can be used if it utilizes a sequential series of data words, each of which has at least one bit thereof (such as control bit m) provided to an input 22d of the gating means, as long as the signal at input 22d is at a low logic level at least once during each imaging sequence, and then abruptly rises to a high logic level at a time shortly before the commencement of a high logic level imaging sequence start request signal provided by the system at input 22b.

Zero-crossing detector means 24-1 receives the AC source 18 signal at a first input terminal 24-1b, with respect to a common input terminal 24-1c. An operational amplifier 28 is utilized as a zero-crossing detector. The inverting input 28a of the operational amplifier is connected to the output tap 29a of an input voltage divider means 29. The voltage divider input 29b s connected to input terminal 24-1b; first divider resistance 30 is connected between input 29b and output 29a, while a second divider resistance 32 is connected between output 29a nd circuit common potential. A capacitance 34 provides high-frequency voltage spike rejection. The non-inverting operational amplifier input 28b is connected to ground potential through a compensating resistor 36. The operational amplifier output 28c provides a train of substantially square waveform signals having minimum and maximum levels established by the voltages at a clamping input 28d, responsive to the voltages at which clamp diodes 38a and 38b conduct. Briefly, diode 38a prevents the comparator output 28c from falling to a level substantially below 0 volts, while diode 38b clamps the maximum output 28c voltage level to that voltage at the junction of voltage divider resistors 40a and 40b; this voltage is typically established to be about 5 volts, for proper interfacing to TTL logic circuitry in means 22. Thus, the train of pulses at detector means output 24-1a is at a substantially low logic level during each positive half-cycle portion of the source 18 sinusoidal waveform and is at a substantially high logic level during the negative polarity portions of that source waveform.

Logic means 22 comprises at least one D-type flip-flop logic element 42. Flip-flop 42 has its reset $\overline{R}$ input connected to a node 43a; this node is typically a wired-OR connection of the control bit m input 22d and the output 43b of at least one gate 43. Gate 43 may be used for such external resetting operations as desired, e.g. providing a low logic level reset $\overline{R}$ signal at the reset $\overline{R}$ input of flip-flop 42 if, and only if, both the external reset enable input 43c is active (high logic level) and an external reset line (at input 22c to input 43d) subsequently goes to a high logic level. The data D input of flip-flop 42 receives a sequence start request signal from input 22b, timed to occur no earlier than the start of the power line cycle prior to desired actual sequence commencement. Another logic means input 22c receives the power line zero-crossing signal from detector means output 24-1a. This substantially square wave signal is coupled to the input 44a of a low-pass-filter/debouncer (e.g. a digital low-pass-filter) 44, which provides a pulse train signal to the clock C input of flip-flop 42. It should be understood that additional means 22 may be used for synchronizing other operations to other external events, such as cardiac gating and the like in magnetic resonance imaging of living subjects, to reduce motion artifacts in a manner similar to the artifact-reduction method of the present invention.

In operation, zero-crossing detector means 24-1 and logic means 22 cooperate as follows: some time prior to the start of the first imaging sequence, the signal on a line assigned to control bit m, in the system control bus, provides a logic zero signal to input 22d; this logic zero signal resets the Q output of flip-flop 42 to a low logic level. This low logic level at output 22a is interpreted as the lack of an end-of-period (EOP) signal, which EOP signal will, when present at a logic 1 level, signal the end of a sequence and cause initiation of the beginning of the next sequence. Preparatory to, e.g. slightly before, the time at which a first sequence start request signal will appear at input 22b, the data word on the system control bus then changes to provide the control bit m signal at a logic 1 level. This logic 1 signal removes the reset to flip-flop 42; the previously-reset Q output is not yet changed and a low logic level is maintained thereat. Slightly thereafter, the high-logic-level sequence start request signal arrives at input 22b; the clock C input is still at a low logic level, so that the Q output remains low and the imaging sequence does not yet commence. At the next-occurring zero crossing of the line source 18 signal waveform in the appropriate direction, a logic 1 level appears at input 22c, causing a logic 1 level to appear at filter output 44b and provides the necessary transition to the high logic level at the clock C input, coupled with the high logic level still present at the data D input, to set the Q output to the logic 1 level. Thus, responsive to a desired-polarity, e.g. positive-going, zero crossing of the power line signal waveform, a logic 1 level signal appears at output 22a, appearing to indicate that an end-of-period signal has occurred and thus calling for the start of the next (i.e. first) imaging sequence in the system. As this first sequence progresses and the control words on the control bus change, at least one word, at a time just preparatory to (i.e. within less than one line frequency cycle of) the desired start of the next sequence has the control bit m thereof fall to the low-logic-level condition, preparatory to returning to a high-logic-level condition prior to both the next sequence start request at input 22b and positive-going zero-crossing signal at input 22c, so that the second sequence can be initiated. Because the reset signal at input 22d and the sequence start request signal at input 22b both appear prior to the logic 1 level at input 22c, responsive to a source 18 signal waveform zero crossing, each sequence starts at a zero crossing after the initial request therefor. As long as a delay interval $T_d$ is programmed to a minimum value to assure that the sequence occurs over an even number of waveform cycles, deleterious power line frequency signal pickup is averaged out of the magnetic resonance imaging signals and interference artifacts are substantially minimized, if not essentially prevented.

Figure 2E:
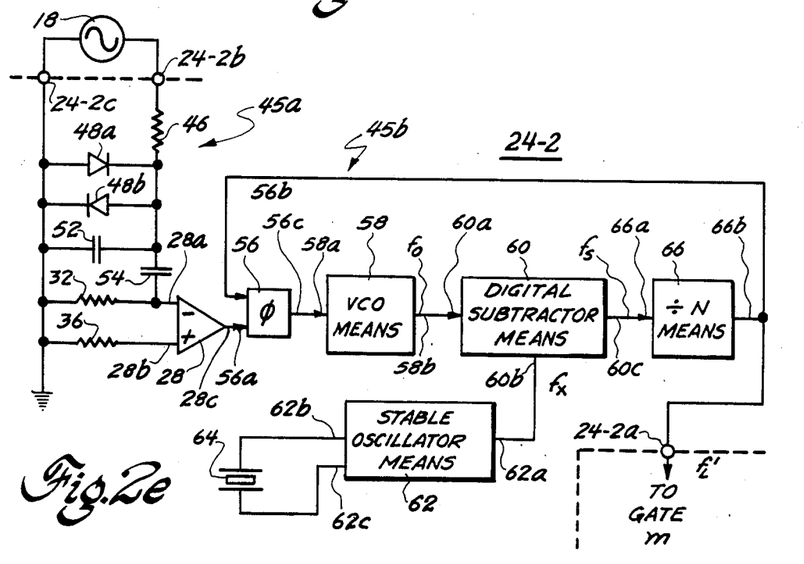
FIG. 2e is a schematic block diagram of another presently preferred form of apparatus for actual line frequency zero-crossing synchronization of magnetic resonance imaging sequences.

In some locations, power line noise has been of sufficient amplitude to cause production of false edges in the comparator output 28c signal waveform, resulting in starting of an imaging sequence at an improper time and attendant production of image artifacts. The zero-crossing means 24-2 of FIG. 2e has a high degree of power line noise immunity, and is presently preferred for use as zero-crossing detector means 24. The source 18 AC sinusoidal waveform again appears between input terminals 24-2b and 24-2c; an output signal with a final frequency $f_L$, having transitions corresponding to those of the power line frequency signal, appears at the detector means output 24-2a. Detector means 24-2 comprises a zero-crossing detector portion 45a and a phase-locked loop portion 45b. Zero-crossing detector portion 45a utilizes the operational amplifier 28, with similar resistance elements 32 and 36 coupled to circuit common potential from respective inverting and non-inverting inputs 28a and 28b thereof. The "floating" input terminal 24-2b is connected through a first resistance element 46 to anti-parallel-connected diodes 48a and 48b. The junction 50 between diodes 48 and resistor 46 is also shunted by a spike-suppression capacitance 52 and is connected through a series capacitance 54 to the operational amplifier inverting input 28a and resistor 32 thereat. Diodes 48 clip the magnitude of the input AC signal (which typically has an amplitude, at the source, of at least 170 volts peak in either polarity direction) to a peak value of less than 1 volt, while capacitor 52 substantially shunts noise peaks, and capacitor 54 allows only the changing edges of the clipped AC signal to appear across resistance 32 and control the operational amplifier output 28c signal. This signal, at the line frequency $F_L$, is applied to the reference input 56a of a phase detector means 56. The signal input 56b of the phase detector receives the signal at the zero-crossing means output 24-2a. Responsive to the phase difference between the line zero-crossing signal at input 56a and the output signal at input 56b (which signals are both at substantially the same frequency), an error voltage is provided at phase detector output 56c to the control voltage input 58a of a voltage controlled oscillator (VCO) means 58. The signal at VCO means output 58b has a frequency $f_O$, nominally of 71680 Hz. This signal is applied to a first input 60a of a digital subtractor means 60. A second subtractor means input 60b receives another signal at a frequency $f_x$, nominally of 7.936 MHz., from the output 62a of a stable oscillator means 62. The highly-stable frequency $f_x$ of oscillator means 62 is typically provided by a frequency-determining element 64, such as a quartz crystal and the like, connected between frequency-determining inputs 62b and 62c. The digital subtractor means output 60c provides a signal having a frequency $f_s$ which is the difference between the stable oscillator frequency $f_x$ and the variable-frequency oscillator output signal $f_O$, i.e. $f_s = f_x - f_O$; or for the foregoing illustrative values, $f_s = 7936000 - 71680 = 7864320$ Hz. The $f_s$ frequency signal is applied to the input 66a of a frequency-divider means 66, which provides a pulse-train signal at its output 66b, which is at a frequency $f_L' = f_s/N$. For a 17-stage binary counter utilized as divide-by-N means 66, N=131,072, and $f_L' = 7864320/131072 = 60.00$ Hz., which is the nominal line frequency of source 18, and is locked thereto. Thus, if the line frequency falls to its lowest magnitude, at about 59.98 Hz., the discrepancy between the frequency of that signal at input 56a and the temporary frequency of the signal at input 56b causes a voltage to be provided to control input 58a such that the VCO means output frequency is increased to about 74301 Hz. and the difference frequency $f_s$ falls by the amount necessary to bring the divided, output frequency $f_L'$ to the required 59.98 Hz. Similarly, for positive-going frequency excursions of source 18, the temporary difference in frequency of the signals at inputs 56a and 56b provides a control voltage at input 58c causing the VCO means output 58b signal frequency $f_o$ to decrease, such that the subtractor means output signal frequency $f_s$ and the divider means output frequency $f_L'$ both increase by the required amount to cause the frequency of the signal at output 24-2a to equal the frequency of the signal at reference input 56a. Because the loop portion 45b can be heavily shielded and noise pulses are substantially prevented from appearing at the zero-crossing detector portion output (amplifier output 28c), a synchronizing signal which accurately and rapidly follows the actual frequency of source 18, without false triggering on noise pulses, is provided at gate m terminal 22c.

While several presently preferred embodiments of our novel method of, and apparatus for, minimizing magnetic resonance imaging motion artifacts due to power line interference have been described herein in detail, many variations and modifications will now become apparent to those skilled in the art. It is our intent, therefore, to be limited only by the scope of the appending claims, and not by the specific details or instrumentalities presented by way of explanation of the presently preferred embodiments herein.

What we claim is:

1. A method for minimizing power line interference artifacts in an image formed by a magnetic resonance imaging system having power supplied thereto from an AC power line, comprising the steps of:
   (a) providing a sequential plurality of imaging signal sequences for determining the pixel data of the total image;
   (b) requiring the presence of a first signal to initiate the start of each signal sequence;
   (c) recognizing a predetermined occurrence of a repetitive power line signal parameter to provide each first signal at each zero crossing of the power line signal and exactly at the frequency thereof even if the power line signal contains undesirable transients; and
   (d) causing each signal sequence to occur in essentially an integral number of sequential repetitive cycles of the power line signal to minimize the magnitude of power line interference artifacts in the resulting magnetic resonance image.

2. The method of claim 1, wherein step (c) further comprises the step of: providing the first signal only at power line signal zero crossings in a preselected direction.

3. The method of claim 1, wherein the exact-signal-frequency-providing step includes the step of: phase-locking the first signal frequency to the power line signal frequency.

4. The method of claim 3, wherein step (b) further comprises the step of: providing an enable signal prior to a desired enablement of each signal sequence; and step (c) further comprises the step of: then accepting the next-occurring first signal to initiate the associated signal sequence.

5. The method of claim 4, wherein step (d) includes the steps of: providing each imaging signal sequence in a sequence time interval necessary to obtain pixel data; adding a delay time interval to the end of each imaging signal sequence; and adjusting the delay time interval to cause the total duration of each sequence time interval and delay time interval to be essentially equal to an integral multiple of the inverse of the average power line signal frequency.

6. The method of claim 1, wherein step (b) further comprises the step of: providing an enable signal prior to a desired enablement of each signal sequence; and step (c) further comprises the step of: then accepting the next-occurring first signal to initiate the associated signal sequence.

7. The method of claim 6, wherein step (d) includes the steps of: providing each imaging signal sequence in a sequence time interval necessary to obtain pixel data; adding a delay time interval to the end of each imaging signal sequence; and adjusting the delay time interval to cause the total duration of each sequence time interval and delay time interval to be essentially equal to an integral multiple of the inverse of the average power line signal frequency.

8. The method of claim 1, wherein step (d) includes the steps of: providing each imaging signal sequence in a sequence time interval necessary to obtain pixel data; adding a delay time interval to the end of each imaging signal sequence; and adjusting the delay time interval to cause the total duration of each sequence time time interval and delay time interval to be essentially equal to an integral multiple of the inverse of the average power line signal frequency.

9. Apparatus for minimizing power lien interference artifacts in an image formed by a magnetic resonance imaging system having power supplied thereto from an AC power line, said system having both means for providing an imaging sequence request signal and means for providing a sequential plurality of imaging signal sequences for determining the pixel data of the total image, and each of which signal sequences is provided responsive to receipt of one imaging sequence request signal at a sequence control input, said apparatus comprising:
   means for recognizing a predetermined occurrence of the zero crossing of the waveform of the signal on said power line to provide a first signal exactly at the power line signal frequency; and
   logic means receiving said imaging sequence request signal for providing the imaging sequence request signal to said sequence control input only upon receipt of said first signal from said recognizing means;
   said system causing each imaging signal sequence to occur in essentially an integral number of sequential repetitive cycles of the power line signal to minimize the magnitude of the power line interference artifacts in the resulting magnetic resonance image.

10. The apparatus of claim 9, wherein said recognizing means provides said first signal only for a power line signal zero crossing in a predetermined direction.

11. The apparatus of claim 9, wherein said recognizing means comprises a comparator having a first input receiving a reference zero potential, a second input receiving the power line signal, and an output having said first signal thereat with first and second levels respectively responsive to said power line signal being respectively greater than and less than said reference potential.

12. The apparatus of claim 11, further comprising means cooperating with said comparator for limiting the comparator output signal to first and second predetermined binary levels.

13. The apparatus of claim 11, further comprising phase-locked loop means receiving the comparator output signal for providing said first signal exactly at said power line signal frequency even if said power line signal contains undesirable transients.

14. The apparatus of claim 13, wherein said phase-locked loop means comprises: a phase detector having a first input receiving said comparator output signal, a second input, and an output at which an error signal is provided responsive to the phase difference between the signals at said first and second inputs; voltage-controlled oscillator means for providing a signal having a first frequency $f_O$ responsive to said error signal; oscillator means for providing another signal having a highly stable frequency $f_x$; digital subtractor means for providing an additional signal having a frequency $f_s$ equal to the difference between the signal frequencies $f_x$ and $f_o$; and means for dividing the additional signal frequency $f_s$ by an integer factor N to provide a divided output signal, to said phase detector second input and to said logic means, substantially instantaneously equal to the actual power line signal frequency.

15. The apparatus of claim 9, further comprising means for preventing said logic means from utilizing said first signal until said system has provided an enable logic signal as part of each imaging sequence and prior to the occurrence of said first signal.

16. The apparatus of claim 15, wherein said preventing means comprises a data flip-flop logic element having a data D input receiving a positive-going enable signal from said system, a clock C input receiving said first signal, and a Q output providing the imaging sequence request signal only if said first signal occurs after the occurrence of said enable signal.

* * * * *